United States Patent [19]

Aspiotis et al.

[11] Patent Number: 4,556,847

[45] Date of Patent: Dec. 3, 1985

[54] METHOD OF QUANTITATIVE ANALYSIS OF SUBSTANCES AND NUCLEAR-RESONANT QUANTITATIVE ANALYZER THEREFOR

[75] Inventors: Evgeny K. Aspiotis; Boris Y. Vitjuk; Evgeny I. Malakhov; Boris V. Danshin, all of Krasnodar; Vladimir A. Sokolov, Odessa; Anatoly S. Sidorov, Odessa; Leonid V. Volkov, Odessa, all of U.S.S.R.

[73] Assignee: Vsesojuzny Nauchno-Issledovatelsky Institut Maslichnykh Kultur Imeni V.S. Pustovoita, Krasnodar, U.S.S.R.

[21] Appl. No.: 549,446

[22] Filed: Nov. 7, 1983

[51] Int. Cl.[4] .............................................. G01R 33/08
[52] U.S. Cl. ...................................... 324/307; 324/300
[58] Field of Search ................ 324/300, 307, 312, 318, 324/322

[56] References Cited

U.S. PATENT DOCUMENTS 3,691,455 9/1972 Moisio .................................. 324/307

OTHER PUBLICATIONS

Journal of American Oil Chemist Society, vol. 45, pp. 775-777, Application of Wide-Line NMR . . . by Pohle, Nov. 1968.
Newport Mk III Product Brochure, by Newport Instruments, published before Nov. 7, 1983.
Product Brochure for Bruker Minispec P 20.

Primary Examiner—Michael J. Tokar
Assistant Examiner—Glenn Peterkin
Attorney, Agent, or Firm—Fleit, Jacobson, Cohn & Price

[57] ABSTRACT

A method of quantitative analysis of substances based on nuclear magnetic resonance comprises the steps of weighing a sample of substance to be analyzed, obtaining therefrom and accumulating nuclear magnetic resonance signals during n measuring cycles, computing a mean value of the nuclear magnetic resonance signals, and determining percentage of components in the sample being analyzed with regard to its mass and the mean value of the nuclear magnetic resonance signals. The mean value of the accumulated signals and its standard deviation are computed as the accumulation occurs during each of the n measuring cycles, the subsequent step being subtraction of the standard deviation from the permissible limiting standard deviation value whereupon the accumulation is stopped during the $n_i$th cycle in which a difference between said magnitudes is a positive value. A nuclear-resonant quantitative analyzer for accomplishing the aforesaid method comprises a magnetic system, a nuclear magnetic resonance signal pick-up arranged in its gap, an amplifier, a selector and an analog-to-digital converter, which are connected to the output of said pick-up, a video-pulse generator connected to the input thereof, and a radio-pulse generator. The analyzer also comprises an automatic sample weighing unit composed of such series-connected components as a weight-to-frequency converter, a load-receiving platform thereof being inserted in the nuclear magnetic resonance pick-up, and a frequency-to-code converter, a data swapping unit, a processor, a control unit, a programming unit and a data output unit.

3 Claims, 1 Drawing Figure

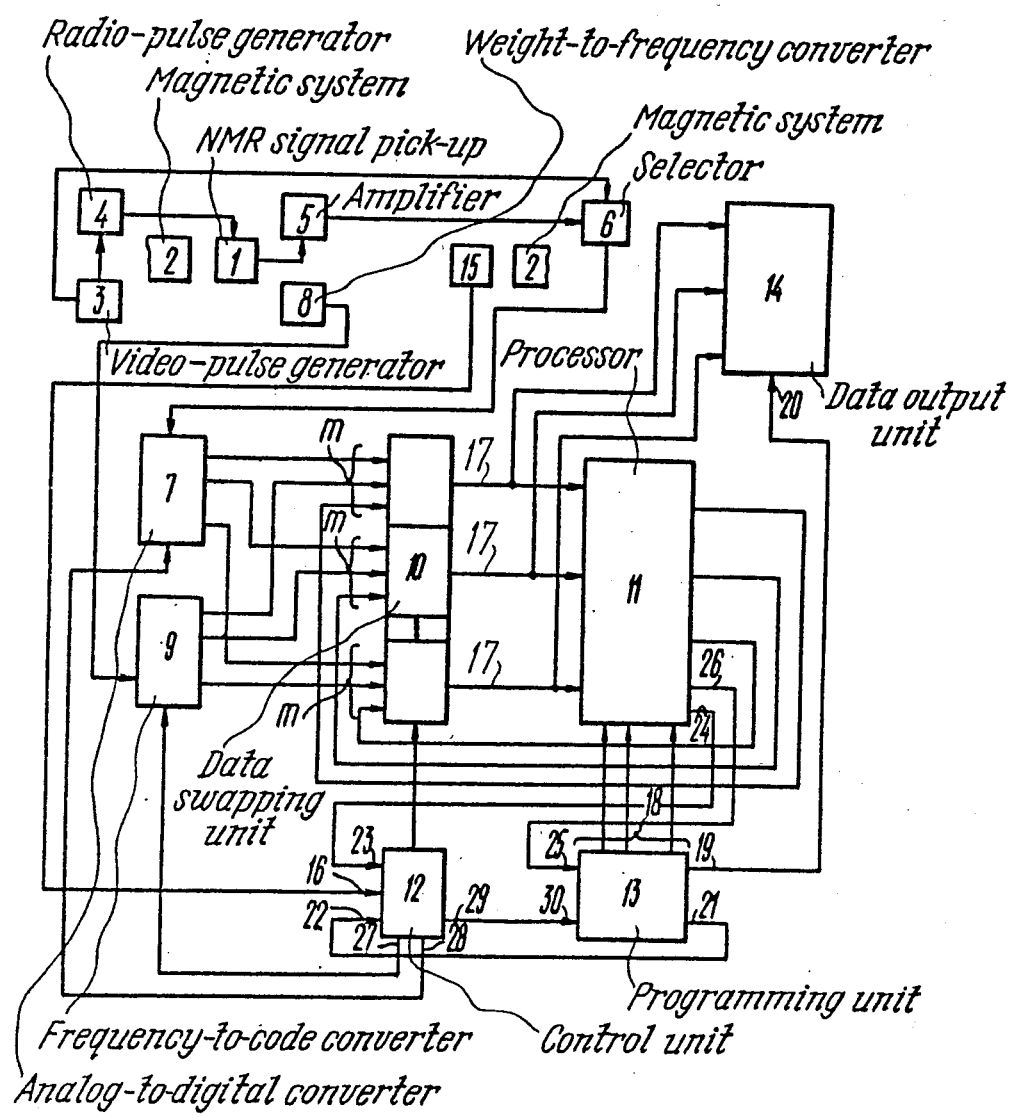

METHOD OF QUANTITATIVE ANALYSIS OF SUBSTANCES AND NUCLEAR-RESONANT QUANTITATIVE ANALYZER THEREFOR

FIELD OF THE INVENTION

The invention relates to radiospectroscopy and in particular to a method of quantitative analysis of substances and a nuclear-resonant quantitative analyzer therefor.

The invention may be used for a quantitative analysis of various substances to determine a fat or water content, a solid phase content in fats, petroleum, petroleum products, analysis of polymers, etc., and measurement of times of spin-spin and spin-lattice nuclear magnetic relaxations of these substances. It may be used to advantage in analyzing on a mass scale oil seeds and associated processed products to determine a fat or water content.

PRIOR ART

There are known methods of quantitative analysis of oil seeds to determine a fat or water content, which are based on the fact that the amplitude of a nuclear magnetic resonance (NMR) signal is proportional to the number of hydrogen nuclei contained in molecules of these substances. With the aforesaid methods, a sample to be analyzed is weighed and placed in a NMR signal pick-up whereupon NMR signals proportional to the amount of fat and water in the sample are obtained. A fat and water content is determined considering the sample mass and the value of the NMR signal. A random component of a measuring error is dependent upon the parameters of an analyzer, primarily, upon a signal-to-noise ratio, noise immunity and random errors. The analyzing error is excessively large when the operating conditions are unfavourable.

Accumulation and averaging of NMR signals during n cycles are operations widely used to enhance a measuring accuracy. Such techniques permit substantially increasing the accuracy in measurements since a random component of a measuring error is decreased by $\sqrt{n}$ times. However, a greater number of measuring cycles proportionally increases a measuring time. Thus, in mass measurements when the capacity of the analyzer is to be used to a maximum extent, a compromise solution is to decrease n to a value at which the measuring accuracy is still at the predetermined level. So, in a Newport MK III analyzer accumulation (integration) is possible within four fixed time intervals; 1, 8, 32 and 128 seconds. In a Brooker Minispec II 20 analyzer there are six fixed integration intervals. On the other hand, even a greatly increased accumulation time may not assure a desired analyzing accuracy since the occurrence of major errors during measurements results in a condition when a mean value of a NMR signal is greatly changed.

A disadvantage of the known method is that it does not permit determining accurately a required NMR signal accumulation time, that is, a minimum time sufficient to obtain a desired analyzing accuracy.

Known in the art is a nuclear-resonant quantitative analyzer accomplishing the known method, which comprises a magnetic system, a NMR signal pick-up arranged in a gap of the magnetic system, an amplifier, a selector and an analog-to-digital converter, which are placed in series and connected to the output of said pick-up, its input being coupled to such series-connected components as a video-pulse generator having its second output connected to the second input of the selector and a radio-pulse generator. The analyzer under review also comprises a data output unit connected via its inputs to the outputs of the analog-to-digital converter (cf. description of the Brooker minispec II 20 instrument).

The analyzer under review operates in the following manner. After its turn-on and a warm-up period, a test tube containing a calibration sample is placed in the NMR signal pick-up arranged between the poles of the magnetic system. NMR signals from the calibration sample are used to adjust the analyzer by means of special controls brought out on the front panel, said controls being used to change the parameters of the equipment. The adjustment over, the calibration sample is removed from the NMR signal pick-up and a sample to be analyzed is placed in the pick-up.

Under the action of a train of video pulses $\pi 2, \pi, \pi, \ldots$ coming from the video-pulse generator to the input of the radio-pulse generator, said radio-pulse generator supplies a train of radio pulses $\pi/2, \pi, \pi, \ldots$ to the input of the NMR signal pick-up. From the pick-up output the signals proportional to the amount of the analyzed component in the sample are applied through the amplifier to the input of the analog-to-digital converter and are accumulated during a fixed time interval. Thereafter the NMR signal code is displayed on the panel of the data output unit.

Next, the amount (mass) of the analyzed component in the sample is determined using the NMR signal code by reference to pertinent plots, tables or nomograms or by making computation. Percentage of the analyzed component in the sample is determined with regard to the mass of the sample and the mass of the component.

In order to reduce the effect of single random errors and interference in the known analyzer, the obtained NMR signals are accumulated within a fixed time interval during n operating cycles of the analyzer. The required accumulation time is found experimentally before the analysis of a batch of samples with regard to the data variation range. Inasmuch as during analysis of each sample the number of random errors and noise occurrences is indefinite, accumulation of signals over a predetermined time is inefficient. The data obtained in analysis are not reliable. A greater accumulation time increases an analysing accuracy. However, with most samples it is excessively great, a disadvantage sharply increasing a mean analyzing time.

To decrease the effect of slowly varying parameters of the equipment (due to wear of its elements, temperature changes, etc.), adjustments are periodically made in the known device. This is done by providing appropriate controls. However, much time is spent on operating the controls, which increases a mean time for analyzing one sample, accordingly. Furthermore, the accuracy in adjusting the parameters of the equipment and, in effect, the analyzing accuracy depend on the operator's skill and mood.

The analyzer under review does not include any weighing arrangement. Before the analysis, a sample to be tested is weighed on a laboratory balance. So, such an operation increases the total time required to test each sample.

BRIEF DESCRIPTION OF THE INVENTION

A primary object of the invention is to enhance accuracy in making a quantitative analysis of substances.

Another object of the invention is to reduce time required to make a quantitative analysis of substances.

One more object of the invention is to make a quantitative analysis of substances automatic.

A still another object of the invention is to improve a nuclear-resonant quantitative analyzer to ensure an automatic measuring process.

There is provided a method of quantitative analysis of substances based on the utilization of a nuclear magnetic resonance phenomenon and comprising the steps of weighing a sample of substance to be analyzed, obtaining therefrom and accumulating nuclear magnetic resonance signals during n measuring cycles, computing a mean value of the NMR signals and determining percentage of components in the sample under test with regard to its mass and the mean value of the NMR signals, in which, according to the invention, the mean value of the NMR signals accumulated by the present measuring moment and a standard deviation thereof are computed during signals accumulation in each of the n measuring cycles, the subsequent step being subtraction of the standard deviation from a permissible limiting standard deviation value set before the analysis to obtain a desired analyzing accuracy whereupon the signal accumulation is stopped in the $n_i^{th}$ cycle, in which a difference between said magnitude is a positive value.

There is also provided a nuclear-resonant quantitative analyzer comprising a magnetic system, a nuclear magnetic resonance signal pick-up arranged in its gap, an amplifier, a selector and an analog-to-digital converter being placed in series and connected to the output of said pick-up whose input is connected to such series-connected components as a video-pulse generator having its second output connected to a second input of the selector and a radio-pulse generator, and a data output unit coupled via its inputs to the outputs of the analog-to-digital converter, which, according to the invention, additionally comprises an automatic sample weighing unit composed of such series-connected components as a weight-to-frequency converter whose load-receiving platform is inserted in the NMR signal pick-up and a frequency-to-code converter, a data swapping unit, a processor, a control unit, a programming unit comprising a control circuit and a memory, which generates a sequence of instructions controlling the processor, the data swapping unit and the control unit and ensures storage of sample mass codes and the NMR signals from the sample in an on-line memory of the processor, signal accumulation during n cycles, calculation of the mean value of the obtained NMR signals and a standard deviation in each of the n cycles, subtraction of the standard deviation from a permissible limiting standard deviation value, stoppage of the signal accumulation during the $n_{in}^{th}$ cycle, in which a difference between said magnitudes is a positive value, and computation of percentage of components in the sample with regard to its mass and the mean value of the NMR signals therefrom, the inputs of the data swapping unit being connected to the outputs of respective bits of the analog-to-digital converter, the frequency-to-code converter and the processor, while the outputs of the data swapping unit are connected to the data inputs of respective bits of the processor and the data output unit, the instruction outputs of the programming unit being connected to respective instruction inputs of the processor, a first control output of the programming unit being connected to the control input of the data output unit, a second control output of the programming unit being connected to the first input of the control unit whose second input is connected to the first output of the processor, while the first input of the programming unit is connected to the second output of the processor, two outputs of the control unit being connected to the control inputs of the analog-to-digital and frequency-to-code converters.

To provide for automatic correction of analysis results when parameters of the equipment are changed, the nuclear-resonant quantitative analyzer forming the subject of the invention preferably includes such an additional means as a pick-up indicating presence of an analyzed sample in the NMR signal pick-up, which is connected via its output to a third input of the control unit whose output is, in turn, connected to the second input of the programming unit having an additional memory file controlled by said input, which ensures generation of a sequence of instructions controlling the processor to determine a correction factor with regard to the current mean value of a signal from a reference sample and the value of said signal at the analyzer calibration instant, arranged in the on-line memory of the processor.

The proposed method of quantitative analysis of substances based on utilization of a nuclear magnetic resonance phenomenon makes it possible to appreciably increase an analyzing accuracy and decrease the analysis time, which is an apparent advantage over the prior art. The nuclear-resonant quantitative analyzer for accomplishing the proposed method permits making the analyzing process fully automatic, other advantages being enhanced accuracy and reduced analysis time. Moreover, it is simple to manufacture and may employ semi-conductor devices and completing items which are widely used at the present time.

BRIEF DESCRIPTION OF THE DRAWING

The invention will now be described further with reference to specific embodiments thereof, taken in conjunction with the accompanying drawing which is a block diagram of a nuclear-resonant quantitative analyzer according to the invention.

DETAILED DESCRIPTION OF THE INVENTION

The method of quantitative analysis of substances based on utilization of a nuclear magnetic resonance phenomenon comprises the following operations. A sample to be analyzed is weighed, its mass is recorded and simultaneously NMR signals are obtained therefrom. Upon receipt of each NMR signal, that is, in each measuring cycle, the mean value of all previously obtained signals and a standard deviation thereof are computed from the formula $$S(\tilde{A}) = \sqrt{\frac{\sum_{i=1}^{n} (\tilde{A} - X_i)^2}{n(n-1)}} \qquad (1)$$

where
$S(\tilde{A})$ = evaluation of standard deviation of the means value of the signals;
$\tilde{A}$ = mean signal value;
$X_i$ = value of the ith signal; and
n = number of signals accumulated by the present measuring moment (number of measuring cycles)

Thereafter the value $S(\widetilde{A})$ is substracted from the permissible limiting standard deviation value $S(\widetilde{A})_o$, which is determined before the analysis by the formula $$S(\widetilde{A})_o = \epsilon \cdot t^-$$

where
 $\epsilon$ = permissible limiting value of a random component of a measuring error; and
 t = student coefficient of a given level of confidence.

Stated differently, the two values are compared and the accumulation is continued if $S(\widetilde{A}) > S(\widetilde{A})_o$. The accumulation is stopped during the $n_i^{th}$ cycle when $S(\widetilde{A})_o$ exceeds $S(\widetilde{A})$ and the difference therebetween is a positive value.

Percentage of components in the sample under test is determined with regard to its mass and the mean value of the NMR signals from the sample using the known relationship between the value of the NMR signal and the amount of the tested component.

A random component of a measuring error does not exceed $\epsilon$ for a given level of confidence.

The proposed method of quantitative analysis of substances based on utilization of a nuclear magnetic resonance phenomenon is accomplished by the use of the nuclear-resonant quantitative analyzer shown in the accompanying drawing. The analyzer is designed for determining percentage of fat and water in oil seeds and associated processed products.

Referring to the drawing the nuclear-resonant quantitative analyzer forming the subject of the invention comprises a NMR signal pick-up 1 arranged in a gap of a magnetic system 2, a video-pulse generator 3 and a radio-pulse generator 4 whose output is connected to the input of the NMR signal pick-up 1, while its input is connected to the output of the video-pulse generator 3. The analyzer also comprises such series-connected components as a NMR signal amplifier 5, a selector 6 and an analog-to-digital converter 7, the input of the amplifier 5 being connected to the output of the NMR signal pick-up 1, while the second input of the selector 6 is connected to the second output of the video-pulse generator 3. Besides, the analyser comprises such series-connected components as a weight-to-frequency converter 8 and a frequency-to-code converter 9, a load-receiving platform of the weight-to-frequency converter 8 being inserted in the lower portion of the cylindrical cavity of the form of an inductance coil of the NMR signal pick-up 1 (not shown in the drawing). The NMR signal pick-up 1 also includes a permanently arranged calibration sample possessing a stable characteristic.

The nuclear-resonant quantitative analyzer in compliance with the invention also comprises a data swapping unit 10 having m inputs in each bit, a processor 11, a control unit 12, a programming unit 13 including a control circuit and two memory files, a data output unit 14, and a pick-up 15 indicating presence of the analyzed sample in the NMR pick-up 1, which is connected via its output to an input 16 of the control unit 12. The inputs of the data swapping unit 10 are connected to the output of respective bits of the analog-to-digital converter 7, the frequency-to-code converter 9, and the processor 11. Outputs 17 of the data swapping unit are connected to the data inputs of respective bits of the processor 11 and the data output unit 14. Instruction outputs 18 of the programming unit 13 are connected to the instruction inputs of the processor 11, while an output 19 of the programming unit 13 is connected to a control input 20 of the data output unit 14, an output 21 of the programming unit 13 being connected to an input 22 of the control unit 12 having its input 23 connected to an output 24 of the processor 11, an input 25 of the programming unit 13 being connected to an output 26 of the processor 11. Two outputs 27 and 28 of the control unit 12 are, respectively, connected to the control inputs of the analog-to-digital converter 7 and the frequency-to-code converter 9, an output 29 of the control unit 12 being connected to an input 30 of the programming unit 13. The magnetic system 2 may comprise an electromagnet or a permanent magnet including an NMR-signal induction stabilizer for a magnetic field in the working gap. The NMR signal pickup 1 may use a single-coil circuit with a ratio of winding length to its diameter being at least 1.5. The units 3, 4, 5, 6, 7, 9, and 12 may employ readily available AND, OR and NOT gates, flip-flops, counters, operational amplifiers, transistors and the like. The weight-to-frequency converter 8 may include two converting means for weight-to-linear-displacement conversion and linear-displacement-to-frequency conversion, said means being fabricated from suitable nonmagnetic materials. The data swapping unit 10 may use multiplexers. It is also of advantage that the programming unit 13 should use re-programmable permanent memories with electrically swapped data and long retention thereof with power supplies being turned off or on. It is also advantageous that the processor 11 should use highly integrated microcircuits, the data output unit 14 provided with light-emitting elements and an alphanumeric printer.

Desirably the pick-up 15 is a photosensor with a photo-resistor and a light source.

The method of quantitative analysis of substances based on utilization of a nuclear magnetic resonance and realized in the preferred device will become more apparent from the description of the analyzer operation which, according to the invention, is as follows.

The operating cycle of the analyzer includes two modes: a "correction" mode and an "analyzing" mode. The operation starts in the "correction" mode on activation of the "start" buttons when a sample to be analyzed is not yet placed in the NMR signal pick-up 1. A logic "0" signal is applied from the output of the pick-up 15 indicating presence of the analyzed sample in the NMR signal pick-up 1 to the input 16 of the control unit 12. Control signals from the output 29 of said unit are fed to the input 30 of the programming unit 13. Upon receipt of these signals, the programming unit 13 addresses locations of the memory file storing the codes of the instructions controlling the processor 11, the data swapping unit 10, the control unit 12 and the data output unit 14 in the "correction" mode. Simultaneously the video-pulse generator 3 generates a train of video pulses $\pi/2, -\pi-\pi \ldots$, which come to the input of the radio-pulse generator 4, gating pulses being also furnished by the video-pulse generator. From the output of the radio-pulse generator 4 the train of radio-pulses $\pi/2-\pi-\pi \ldots$ is fed to the input of the NMR signal pick-up 1. From the output of the NMR signal pick-up 1 free-precession signals and spin echo signals from the calibration sample permanently found in the inductance coil 1 of the NMR signal pick-up 1 are applied to the input of the NMR signal amplifier 5, wherein they are amplified and detected. From the amplifier output said signals are fed to the input of the selector 6 whose second input accepts the gating pulses from the second output of the video-pulse generator. From the output of the selector 6 the video pulses having their amplitude equal to the amplitude of the NMR signals are delivered to the input of the analog-to-digital converter 7. From the output of said converter numeric codes of the NMR signal amplitudes are supplied to the inputs of the data swapping unit 10. At the time the NMR signals are received from the calibration sample, the weight-to-frequency converter 8 furnishes a signal corresponding to "zero" weight (no sample is analyzed), said signal being applied to the input of the frequency-to-code converter 9. From the outputs of said converter a "zero" weight code is supplied to the other inputs of the data swapping unit 10.

In response to the signals from the control unit 12, the data swapping unit 10 transmits the NMR signal codes from the calibration sample and the "zero" weight code to the on-line memory of the processor 11 which, in response to the instruction signals from the programming unit 12 coming to the instruction inputs of the processor 11 stores the NMR signals, computes their mean value and a standard deviation $S(\widetilde{A})$ and compares $S(\widetilde{A})$ with $S(\widetilde{A})_o$. When the condition $S(\widetilde{A}) \leq S(A)_o$ is satisfied, the accumulation process is terminated. Next, a correction factor is calculated by the formula $$K = A_{c \cdot s} A_{cj}^{-1}$$

where
$K$ = correction factor;
$A_{c \cdot s}$ = value of the NMR signal from the calibration sample at the analyzer calibration moment; and
$A_{cj}$ = value of the current NMR signal from the calibration sample.

The "zero" weight code is used to compute a correction:

$$\Delta P = A_{po} - A_{pj}$$

where
$\Delta p$ = correction;
$A_{po}$ = "zero" weight code at the analyzer calibration moment; and
$A_{pj}$ = current "zero" weight code.

After the correction factor K and the correction $\Delta p$ have been determined, their values are stored in locations of the on-line memory of the processor 11, and the output 19 of the programming unit 13 develops an "end-of-correction" signal which is fed to the data output unit 14 wherein it is appropriately displayed. Simultaneously an "end-of-mode" signal is applied from the output 21 of the programming unit 13 to the input 22 of the control unit 12 whose outputs 27 and 28 develop resetting signals for the analog-to-digital converter and the frequency-to-code converter 9. The "correction" mode is, thus, terminated.

The "analyzing" mode begins automatically after a sample to be analyzed is placed in the NMR signal pick-up 1.

A logic "1" signal is applied from the output of the pick-up 15 to the input 16 of the control unit 12. From the output 29 of said unit an "analysis" signal is fed to the input of the programming unit 13. Another memory file is, thus, addressed. Said file shapes control signals and instructions to provide operation in the "analyzing" mode. The "end-of-correction" indication will be no longer present on the panel of the unit 14, and the "analysis" indication will also disappear. The NMR signals from the calibration sample and from the sample under test are amplified, gated, converted into a numeric code and applied to the inputs of the data swapping unit 10 in much the same manner as in the "correction" mode. Similarly, the other inputs of said unit accept the sample weight code furnished by the frequency-to-code converter 9 using the signals of the weight-to-frequency converter 8.

In response to the signals from the control unit 12 and the programming unit 13 delivered to the data swapping unit 10 and to the processor 11, the NMR signal codes and the sample weight code are received by the processor 11 wherein they are adjusted by multiplying the corresponding values into the correction factor K, the correction $\Delta p$ being added up, accordingly. Thereafter the corrected NMR signal codes are stored, and computation is made of their mean value and the magnitude $S(\widetilde{A})$. The signal accumulation ends during the $n_j^{th}$ cycle when $$S(\widetilde{A}) \leq S(A)_o$$

Next, the mean value of the NMR signals and the sample weight code are used to compute, referring to the known relationships, the amount of fat and water in the analyzed sample and relevant percentage. The analysis result codes are supplied from the outputs of the processor 11 to the inputs of the data swapping unit 10 and from its outputs to the inputs of the data output unit 14. The analysis results are displayed and printed. This ends the "analyzing" mode.

The nuclear-resonant quantitative analyzer forming the subject of the invention makes it possible to automatically weight a sample to be analyzed simultaneously with delivery of NMR signals from the sample, another advantage being automatic processing of the obtained information. A desired analyzing accuracy is provided with a minimum NMR signal accumulation time, the proposed analyzer operating without any adjustments. The analyzing accuracy is not dependent upon the operator's skill.

The use of the proposed nuclear-resonant quantitative analyzer in oil-and-fat industries and agriculture makes it possible to make labour and material requirements for analyzing operations less stringent, to select lots of seeds for storage and processing with due regard for qualitative indices, said selection being made more efficient, to determine optimum times for processing oil seeds, to increase production of high-standard oil and the oil output.

What is claimed is:

1. A method of quantitative analysis of substances based on utilization of a nuclear magnetic resonance phenomenon and comprising the steps of determining mass of a sample of substance to be analyzed, obtaining therefrom and accumulating nuclear magnetic resonance (NMR) signals during n measuring cycles, computing during each of said n measuring cycles a mean value of said nuclear magnetic resonance signals accumulated by the present measuring moment, computing during each of said n measuring cycles a standard deviation of said mean value, determining a difference between said standard deviation and a permissible limiting standard deviation value set before the analysis to obtain a desired analyzing accuracy, stopping said accumulation of the NMR signals during the $n_j^{th}$ cycle, in which said difference is a positive value, and determining percentage of components in the sample being analyzed with regard to its mass and said mean value of the NMR signals computed during said $n_i^{th}$ measuring cycle.

2. A nuclear-resonant quantitative analyzer comprising:

a magnetic system; an air gap in said magnetic system; a NMR signal pick-up in said gap; a radio-pulse generator having an input and an output and connected via said output to an input of said NMR signal pick-up; a video-pulse generator having an input and an output and connected via said output to said input of said radio-pulse generator; an amplifier having an input and an output and connected via said input to said output of said NMR signal pick-up; a selector having a first input connected to said output of said amplifier; a second input connected to said output of said video-pulse generator, and an output; an analog-to-digiter converter having a first input connected to said output of said selector, a second input and a plurality of outputs; a weight-of-frequency converter having a load-receiving platform for weighing a sample of substance being analyzed, which is arranged in said NMR signal pick-up, and an output; a frequency-to-code converter having a first input connected to said output of said weight-to-frequency converter, a second input and a plurality of outputs; a data swapping unit having a plurality of data inputs, the first inputs being connected to the respective outputs of said analog-to-digital converter, while the second inputs are connected to said outputs of said frequency-to-code converter, a control input and outputs; a processor having data inputs connected to said outputs of said data swapping unit, instruction inputs and outputs, a control unit having a first input connected to one of the outputs of said processor, a second input, a third input, three outputs, the first of which is connected to said second input of said analog-to-digital converter, the second output being connected to said second input of said frequency-to-code converter, while the third output is connected to said control input of said data swapping unit, and a fourth output; a programming unit having a first input connected to one of the outputs of said processor; a second input, instruction outputs connected to the respective instruction inputs of said processor, a first control output connected to said second input of said control unit, and a second control output;

a data output unit having data inputs connected to the respective outputs of said data swapping unit, and a control input connected to said second output of said programming unit; said programming unit comprising a control circuit and a memory, which generates a sequence of instructions controlling said processor, said data swapping unit and said control unit, and ensures storage of mass and sample codes and corresponding NMR signals in an on-line memory of said processor, accumulation of said signals during n measuring cycles, computation of a mean value of the obtained NMR signals and a standard deviation of said mean value during each of the n measuring cycles, subtraction of said standard deviation from a permissible limiting standard deviation value, stoppage of said signal accumulation during a $n_i^{th}$ measuring cycle, in which a difference between said magnitudes is a positive value, and determination of percentage of components in said sample with regard to its mass and said mean value of the corresponding NMR signals.

3. A nuclear-resonant quantitative analyzer as claimed in claim 1, which additionally comprises a pickup indicating presence of the analyzed sample in said NMR signal pickup and having an output connected to said third input of said control unit whose fourth output is connected to said second input of said programming unit; said programming unit having an additional memory file controlled by said second input, which ensures generation of a sequence of instructions controlling said processor to compute a correction factor with respect to the current value of the signal from a reference sample and the value of said signal at the analyzer calibration instant, arranged in an on-line memory of said processor.

* * * * *